(12) United States Patent
Gupta et al.

(10) Patent No.: US 7,928,597 B2
(45) Date of Patent: Apr. 19, 2011

(54) POWER SYSTEM AND METHOD FOR DRIVING AN ELECTROMOTIVE TRACTION SYSTEM AND AUXILIARY EQUIPMENT THROUGH A COMMON POWER BUS

(75) Inventors: Sudhir Kumar Gupta, Erie, PA (US);
Ajith Kuttannair Kumar, Erie, PA (US); Bret Dwayne Worden, Erie, PA (US); Jeffrey Louis Daigle, Erie, PA (US); Emil Nikolov, Erie, PA (US); Dimitrios Ioannidis, Erie, PA (US)

(73) Assignee: General Electric Company, Schenectady, NY (US)

( * ) Notice: Subject to any disclaimer, the term of this patent is extended or adjusted under 35 U.S.C. 154(b) by 61 days.

(21) Appl. No.: 12/333,611

(22) Filed: Dec. 12, 2008

(65) Prior Publication Data

US 2010/0148581 A1     Jun. 17, 2010

(51) Int. Cl.
*G05F 3/06* (2006.01)
(52) U.S. Cl. .................. 307/9.1; 307/10.1; 307/151
(58) Field of Classification Search .............. 307/9.1, 307/10.1, 151
See application file for complete search history.

(56) References Cited

U.S. PATENT DOCUMENTS

| | | | | |
|---|---|---|---|---|
| 4,855,891 A | * | 8/1989 | Paul | 363/56.08 |
| 4,896,063 A | * | 1/1990 | Roberts | 310/68 R |
| 5,258,902 A | * | 11/1993 | Lindbery et al. | 363/56.12 |
| 5,481,451 A | * | 1/1996 | Kuwahara | 363/37 |
| 6,166,929 A | * | 12/2000 | Ma et al. | 363/37 |
| 6,304,013 B1 | | 10/2001 | Akers et al. | |

(Continued)

FOREIGN PATENT DOCUMENTS

| WO | 2004066492 A1 | 8/2004 |
|---|---|---|
| WO | 2006056235 A1 | 6/2006 |

OTHER PUBLICATIONS

"Engineering Electromagnetic Fields and Waves", Chapter 10, Analysis of Reflective Transmission Lines, Carl T.A. Johnk, Copyright 1975, by John Wiley & Sons, Inc.

(Continued)

*Primary Examiner* — Jared J Fureman
*Assistant Examiner* — Adi Amrany
(74) *Attorney, Agent, or Firm* — Robert Wawrzyn, Esq.; Enrique J. Mora, Esq.; Beusse, Wolter, Sanks, Mora & Maire, P.A.

(57) ABSTRACT

Power system and method for providing electrical power are provided. The system includes a traction system and auxiliary equipment coupled to a power bus. The traction system includes one or more electromotive machines having a first type of stator winding that provides protection relative to voltage spikes expected at the traction stator under a first voltage level appropriate for the traction system. The auxiliary equipment includes one or more electromotive machines having a second type of stator winding that provides protection relative to spikes expected at the auxiliary stator under a second voltage level lower than the first voltage level. Inverter circuitry is coupled to drive the auxiliary equipment, and signal-conditioning circuitry is provided to attenuate voltage spikes produced by the inverter circuitry. The power bus is operated at the first voltage level, and the voltage spike attenuation is sufficient to protect the auxiliary stator.

16 Claims, 3 Drawing Sheets

U.S. PATENT DOCUMENTS

| | | | |
|---|---|---|---|
| 6,366,483 B1* | 4/2002 | Ma et al. ............................ | 363/87 |
| 6,441,581 B1* | 8/2002 | King et al. ..................... | 320/101 |
| 6,455,971 B1* | 9/2002 | Palma et al. ....................... | 310/180 |
| 6,486,568 B1* | 11/2002 | King et al. ......................... | 307/66 |
| 6,678,972 B2* | 1/2004 | Naruse et al. ..................... | 37/466 |
| 6,909,200 B2* | 6/2005 | Bouchon ....................... | 307/10.1 |
| 7,256,513 B2 | 8/2007 | Kumar et al. | |
| 7,304,445 B2* | 12/2007 | Donnelly ........................ | 318/108 |
| 7,535,116 B2* | 5/2009 | Daigle et al. ................. | 290/40 C |
| 7,565,867 B2* | 7/2009 | Donnelly et al. ............ | 105/62.1 |
| 7,573,153 B2* | 8/2009 | Rebbereh ......................... | 307/38 |
| 2002/0096959 A1* | 7/2002 | Qin et al. ......................... | 310/208 |
| 2003/0118891 A1 | 6/2003 | Saito et al. | |
| 2006/0025902 A1* | 2/2006 | Brown et al. ................... | 701/19 |
| 2006/0076171 A1* | 4/2006 | Donnelly et al. ............. | 180/65.2 |
| 2006/0119177 A1 | 6/2006 | Kumar et al. | |
| 2006/0127704 A1* | 6/2006 | Raiser ................................ | 429/9 |
| 2008/0087479 A1* | 4/2008 | Kang ............................ | 180/65.3 |
| 2009/0288577 A1* | 11/2009 | Kumar ............................ | 105/36 |

OTHER PUBLICATIONS

"Instructions for use of wound rotor motors with AC inverters" Drivecon Motor Drives EMD Comtrols, www.drivecon.com, WDRTMTR.p. 65, Sep. 12, 2002.

"Riding the Reflected Wave—IGBT Drive Technology Demands New Motor and Cable Considerations", IEEE IAS-Petroleum & Chemical Industry Conference, Philadelphia, PA., Sep. 23-25, 1996 pp. 75-84.

"Output filters for PWM Drives" GE Capacitors and Power Quality Products, New York, www.geindustrial.com/industrialsystems/products/capacitors.shtml.

"Surge Related Partial Discharges Resulting from IFDs Applied to Random Wound Motors", Mark Fenger, Blake Lloyd, Iris Power Engineering Inc., Toronto, Canada; Jan Pedersen, Techwise A/S, Fredericia, Denmark, Apr. 7, 2002.

* cited by examiner

POWER SYSTEM AND METHOD FOR DRIVING AN ELECTROMOTIVE TRACTION SYSTEM AND AUXILIARY EQUIPMENT THROUGH A COMMON POWER BUS

FIELD OF THE INVENTION

The present invention is generally related to power systems, and, more particularly, to a power system for driving an electromotive traction system and auxiliary equipment.

BACKGROUND OF THE INVENTION

A diesel-electric locomotive typically includes a diesel engine coupled to drive a main alternator and one or more auxiliary alternators. The main alternator is coupled to power one or more traction motors, and the auxiliary alternators are coupled to power locomotive auxiliary electrical equipment, such as radiator fan motors, traction motor blowers, alternator blowers, air compressors, etc.

The auxiliary equipment has generally been operated at a different voltage than the operating voltage of the traction motors. For example, the traction motors may be typically operated at a relatively higher voltage, while the auxiliary equipment may be operated at a relatively lower voltage. The lower voltage operation may allow for the use of auxiliary equipment with relatively lower insulation ratings at their windings to handle correspondingly lower voltage spikes. Such spikes may repetitively (e.g., on every turn-on and turn-off) result from the switching operation of inverter drive circuitry, such as high-speed power switches (e.g., insulated gate bipolar transistor (IGBT) switches and the like) coupled to drive the equipment. Thus, if the voltage level of a common bus, or bus voltage, for powering both the traction motors and the auxiliary equipment were to be set to a sufficiently high voltage level appropriate for powering the traction motors, this would require auxiliary equipment with costlier insulation ratings to avoid potential insulation damage due to the correspondingly higher voltage spikes. It will be appreciated that the magnitude of the voltage spikes may be substantially amplified as a result of standing wave reflections that arise when the distances between the inverter (drive) and the load increases.

Accordingly, the designer may be faced with the choice of using separate power buses for the traction motors and the auxiliary equipment or may be faced with the choice of using costlier motors for the auxiliary equipment, if a common power bus is used. It will be appreciated that either of the foregoing choices incrementally adds to the cost and weight of the locomotive. Thus, there is a need of a practical and reliable power system that provides a cost-effective solution to overcome the above-described issues.

BRIEF DESCRIPTION OF THE INVENTION

Aspects of the present invention provide a power system. The system includes an electrical power source (e.g., an alternator) and a power bus coupled to receive electrical power from the power source. The system further includes a traction system coupled to the power bus. The traction system includes at least one electromotive machine having a first type of stator winding configured to provide a level of protection relative to voltage spikes expected at the traction stator under a first voltage level appropriate for the traction system. Auxiliary equipment is coupled to the power bus. The auxiliary equipment includes at least one electromotive machine having a second type of stator winding configured to provide a level of protection relative to voltage spikes expected at the auxiliary stator under a second voltage level. The second voltage level may be lower than the first voltage level. Inverter circuitry is coupled to drive the auxiliary equipment, and signal-conditioning circuitry may be coupled to attenuate repetitive voltage spikes produced by the inverter circuitry. The power bus may be operated at the first voltage level, and the voltage spike attenuation is sufficient to protect the auxiliary stator notwithstanding of operation of the power bus at the first voltage level.

Further aspects of the present invention provide a method for arranging and operating a powered system. The method allows coupling a power bus to receive electrical power from a power source (e.g., an alternator). The method further allows coupling a traction system to the power bus. The traction system includes at least one electromotive machine having a first type of stator winding configured to provide a level of protection relative to voltage spikes expected at the traction stator under a first voltage level appropriate for the traction system. Auxiliary equipment is coupled to the power bus. The auxiliary equipment includes at least one electromotive machine having a second type of stator winding configured to provide a level of protection relative to voltage spikes expected at the auxiliary stator under a second voltage level. The second voltage level may be lower than the first voltage level. Inverter circuitry is coupled to drive the auxiliary equipment. The power bus may be operated at the first voltage level. Power from the inverter to the auxiliary equipment may be conditioned to attenuate voltage spikes produced by the inverter circuitry and/or interconnecting cables. The voltage spike attenuation is sufficient to protect the auxiliary stator notwithstanding of operating the power bus at the first voltage level.

BRIEF DESCRIPTION OF THE DRAWINGS

Embodiments of the invention are explained in the following description in view of the drawings that show.

DETAILED DESCRIPTION OF THE INVENTION

Aspects of the present invention may be utilized in power systems, such as may be used for driving an electromotive traction system and auxiliary equipment through a common power bus. Example vehicular applications of the power system may be in locomotives, marine vessels, off-highway vehicles (as may be equipped with rubber tires, such as mining vehicles, agricultural vehicles) and transit vehicles. For purpose of illustration, aspects of the invention are described herein as it may be applied to a locomotive.

Figure 1:
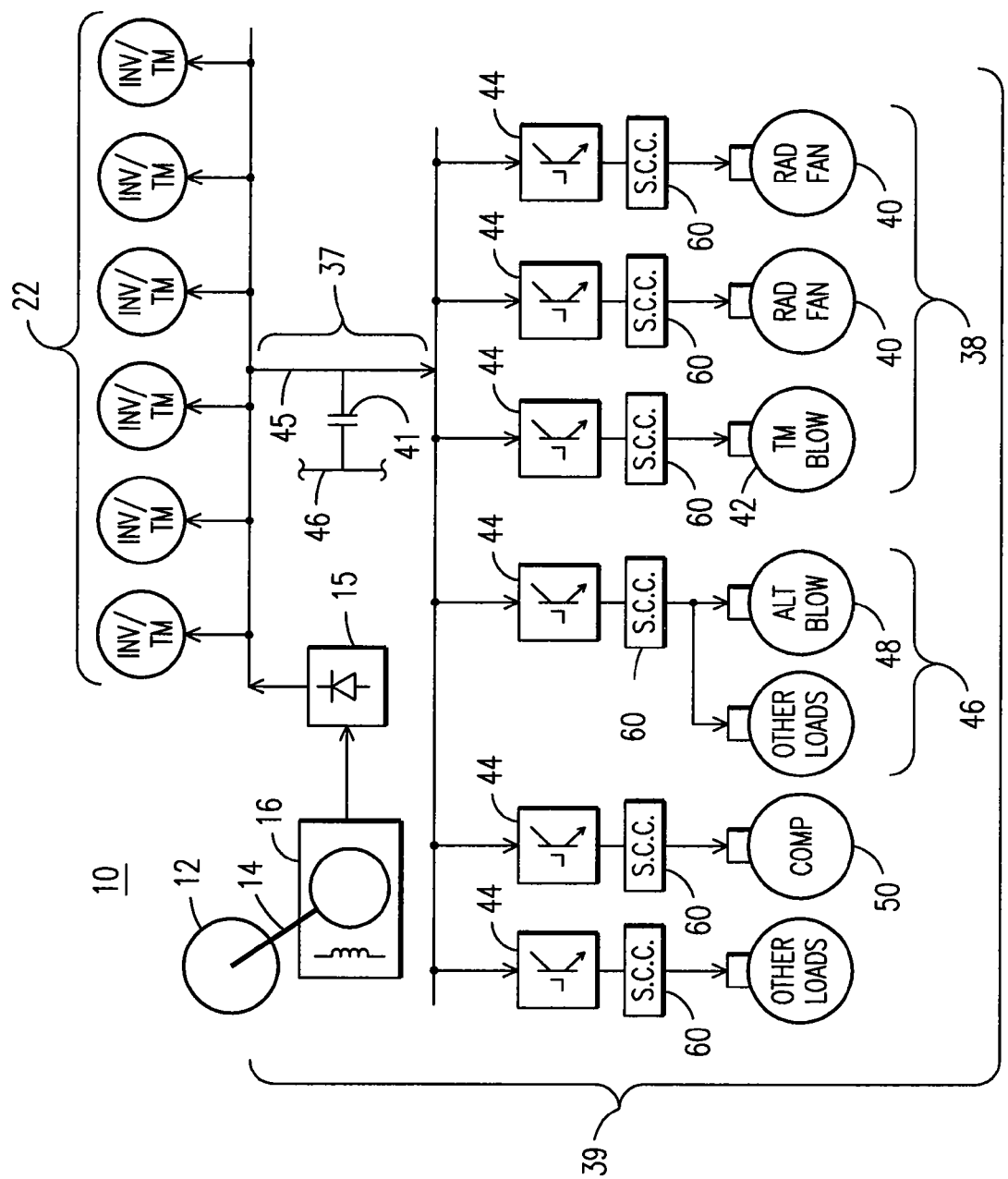
FIG. 1 is a block diagram representation of an example embodiment of a power system embodying aspects of the present invention.

FIG. 1 is a block diagram schematic of an example embodiment of a power system 10 in accordance with aspects of the present invention. In the embodiment depicted in FIG. 1, one or more traction motors (INV/TM) 22 and auxiliary equipment 39 may be connected to a power source, such as a main alternator 16, via a rectifier 15 that provides power to a common power bus 37. For example, the rectifier 15 may be configured for converting the AC power generated by the main alternator 16 to DC power having a voltage sufficient for powering the traction motors 22 and provide the DC power to the common power bus 37. Auxiliary equipment 38, such as a radiator fan motor (RAD FAN) 40, a traction motor blower (TM BLOW) 42, other loads 46, as may include an alternator blower (ALT BLOW) 48, and an air compressor (COMP) 50, may be connected to the bus 37 via respective DC to AC converters, or inverters 44, such as pulse-width modulators (PWMs), that convert the DC power, made available on the bus 37 by the rectifier 15, into AC power having a frequency and voltage independent of the AC power generated by the main alternator 16. The main alternator 16 is typically driven by a mechanical output 14 (e.g., crankshaft and transmission) of an engine 12.

The inventors of the present invention have recognized relatively inexpensive and uncomplicated signal-conditioning circuitry (SCC or S.C.C.) 60 and/or techniques that allow for the coupling of auxiliary equipment (e.g., auxiliary load) 39 to common power bus 37 having a voltage sufficiently high so that the traction motors may be operated at an example voltage range from approximately 1,000 volts to approximately 1500 volts.

In one example embodiment, the traction system includes one or more electromotive machines having a first type of stator windings (e.g., form-wound windings) configured to provide a level of protection relative to voltage spikes expected at the traction stator under a first voltage level appropriate for the traction system (e.g., from approximately 1000 volts to approximately 1500 volts). That is, the electromotive machine operates at (or around) the first voltage level, but may receive voltage spikes above the first voltage level, which are at least partially protected against by the stator windings. By way of comparison, the auxiliary equipment may include one or more electromotive machines having a second type of stator winding (e.g., random-wound windings) configured to provide a level of protection relative to voltage spikes expected at the auxiliary stator when operating under a second voltage level lower than the first voltage level (e.g., from approximately 400 volts to approximately 750 volts). In operation, the voltage spike attenuation provided by SCC 60 is sufficient to protect the auxiliary stator notwithstanding operation of the power bus at the first voltage level.

In one example embodiment, SCC 60 comprises respective filters (e.g., low-pass filters (LPFs) or band-pass filters (BPFs) configured to suppress (e.g., attenuate) repetitive (e.g., recurring) voltage spikes produced under relatively high dV/dt conditions resulting from the switching operation of inverter drive circuitry, such as high-speed power switches, coupled to drive the equipment.

Figure 3:
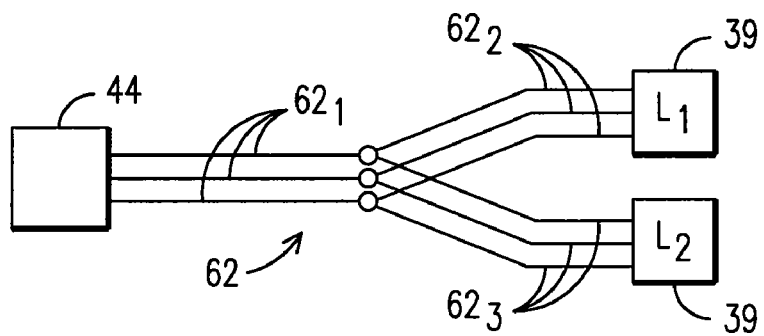
FIG. 3 is a schematic representation including example embodiments of signal-conditioning circuitry based on impedance matching that may be used in the power system of FIG. 1.

In another example embodiment, SCC 60 may be realized without the use of filters (or in combination with filters), as such circuitry may be realized through appropriate selection of the characteristics of interconnecting lines 62 (FIG. 3) for interconnecting one or more auxiliary loads 39 to a given inverter 44. For example, the respective impedance of connecting lines $62_1$, $62_2$ and $62_3$ may be selected to substantially match the impedance characteristics of the auxiliary load, and in this manner reduce the coefficient of reflection of the lines, which is conducive to reducing the magnitude of the voltage spikes produced under high dV/dt conditions. For readers desirous of general background information in connection with impedance matching techniques reference is made to chapter 10 (Analysis of Reflective Transmission Lines) of the textbook titled "Engineering Electromagnetic Fields and Waves" by Carl Johnk copyright© 1975 by John Wiley & Sons, Inc.

In yet another example embodiment, one may reduce the rate of change (dV/dt) by adjusting (e.g., slowing down) the switching speed of the inverter switching devices, such as by making appropriate changes in their respective gate drive circuits or by choosing a relatively lossier switching device (e.g., power switching devices having an inherently lesser rate of change dV/dt. For example, a typical switching speed of IGBTs, as may be used in inverters, is approximately 10,000 Volts/microsecond. In one example embodiment, it has been shown that one may slow down the switching speed to approximately 1000 Volts/microsecond to reduce the voltage spikes at the auxiliary load terminals to acceptable levels within about 100 feet of cable. It will be appreciated that the level to which a given switching device is slowed down may be a function of cable length and the desired level of voltage spike suppression at the auxiliary load terminals.

It is contemplated that the signal conditioning may be a combination of the above-described operations. For example a combination of at least two of a) filtering the signals from the inverter circuitry to the auxiliary equipment; b) establishing an impedance match between the auxiliary equipment and at least one line interconnecting the inverter circuitry and the auxiliary equipment; and c) adjusting a switching speed of a power switching device in the inverter circuitry.

As a result of the voltage spike filtering, voltage reflection attenuation, switching speed reduction, or combination of the foregoing, it is now practical to use in one example embodiment, random-wound motors in the auxiliary equipment 39. As will be appreciated by one skilled in the art, random-wound motor windings can be made at reduced costs over form-wound windings. However, the arrangement of random-wound windings may be more vulnerable to voltage spikes than form-wound windings. More particularly, in form-wound windings the winding turns are arranged in a precise spatial arrangement relative to one another. For example, in a form-wound construction, turn one may be always next to turn two, turn two may be always next to turn three, and so on. By way of comparison, in random-wound windings the turns have a random location and the wires in a given turn can be arranged next to any other turn.

As noted above, prior to the present invention, the voltage spikes repetitively resulting from the switching operation of inverter drive circuitry could have lead to a premature failure of a random-wound motor and that is why such type of motors could not be utilized in a practical power system with a common bus for directly powering both the traction motors and the auxiliary equipment. However, in accordance with aspects of the present invention, signal-conditioning circuitry 60 allows one to couple random-wound motors on the same power bus for the traction motors.

Figure 2:
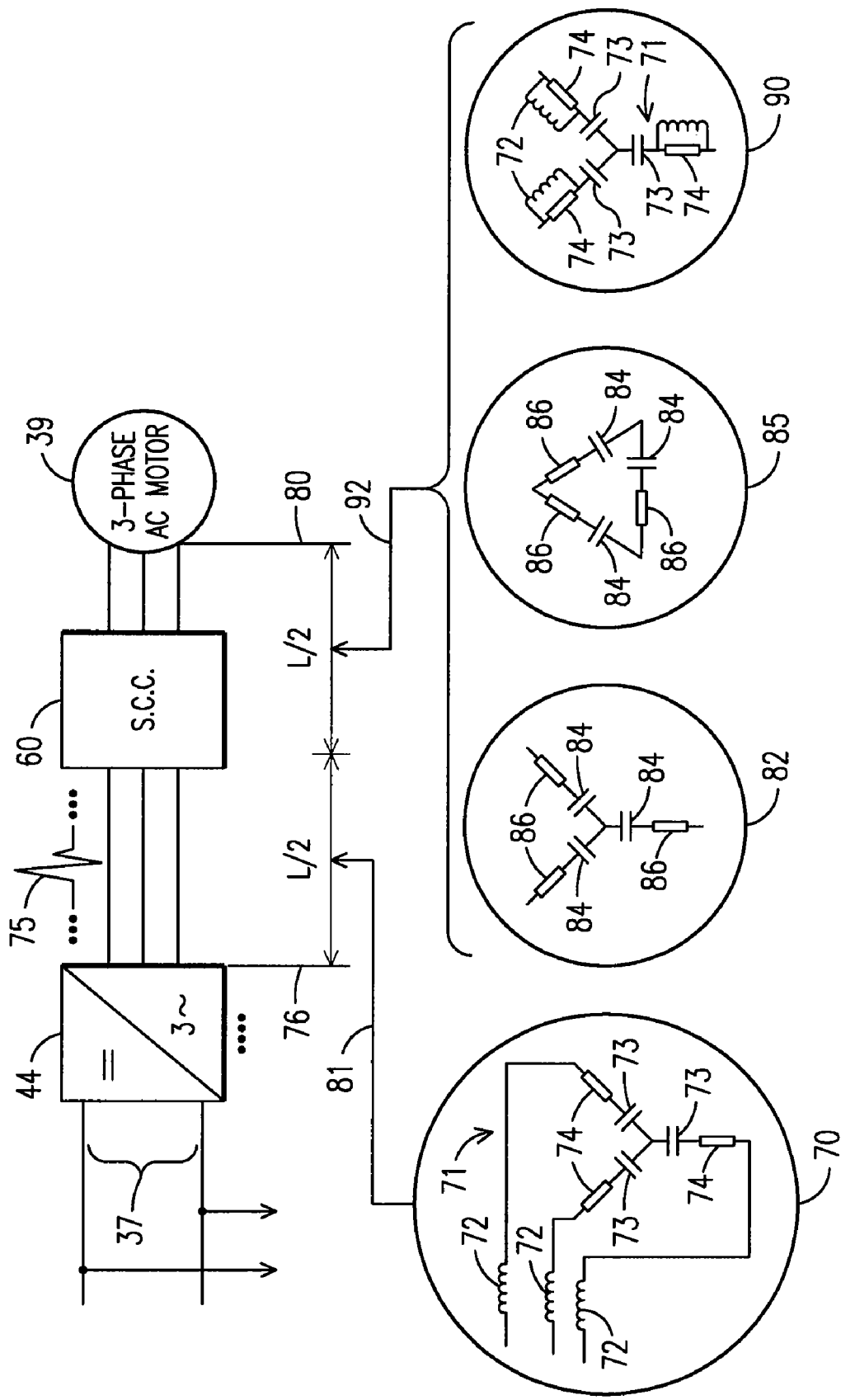
FIG. 2 is a schematic representation including example embodiments of signal-conditioning circuitry (e.g., filter circuitry) that may be used in the power system of FIG. 1.

In one example embodiment, the signal-conditioning circuitry may comprise an RLC-based (resistor/inductor/capacitor) filter (e.g., band-pass filter) arranged in a Y-circuit topology, as schematically illustrated in inset 70 in FIG. 2. In this example embodiment, in each filter branch 71, a respective inductor 72 is in series circuit with a capacitor 73 and a resistor 74 with respect to the voltage spikes 75. Presuming the line separation from an output side (conceptually represented by line 76) of a given auxiliary inverter 44 to an input side (conceptually represented by line 80) of a given auxiliary load 39 is a first distance L, then it is contemplated that in the event such a filter topology is used, one example range for locating such a filter may be from the output side 76 of auxiliary inverter 44 to a second distance L/2 downstream from the inverter, as schematically represented by arrow 81.

In another example embodiment, the signal-conditioning circuitry may comprise an RC-based (resistor/capacitor) low-pass filter as schematically illustrated in respective insets 82 (Y-circuit topology) and 85 (Δ-circuit topology, i.e., delta-circuit topology) in FIG. 2. As will be appreciated by one skilled in the art, in this case the filtering operation is primarily achieved by the low-reactance provided by capacitors 84 in combination with resistors 86 with respect to the voltage spikes 75. In this case, capacitors 84 operate as shorting elements with respect to such spikes.

Inset 90 illustrates an RLC-based low-pass filter also arranged in a Y-circuit topology. In this example embodiment, in each filter branch 71, a respective inductor 72 is in parallel circuit with a respective resistor 74 and this parallel circuit is series connected to a respective capacitor 73. Again presuming a line separation from the output side of auxiliary inverter 44 to the input side of auxiliary load 39 is a distance L, then it is contemplated that if one uses any of the filter topologies respectively illustrated in insets 82, 84 or 90, then one example range for locating such filters may be from the input side of the auxiliary load to a distance L/2 upstream from the auxiliary load, as schematically represented by arrow 92. In one example application, the filter location may be up to about 15-20 feet from the auxiliary load, however, a preferred location may be as near as practical to the auxiliary load.

It will be appreciated that the value of one or more of the filter elements need not be fully-based on the value of discrete components since, for example, one can estimate and/or model a reactance (capacitance or inductance) of any auxiliary load coupled to a given inverter, as well as the intrinsic reactance of a connecting line itself, and one can make use of the value of the load and intrinsic reactance for implementing at least some of the filter circuitry. It will be appreciated by those skilled in the art that the estimating and/or modeling of the load and intrinsic reactance may be accomplished using any standard estimating and/or modeling tools, such as are commonly available and well-understood in the art of transmission line design.

Figure 4:
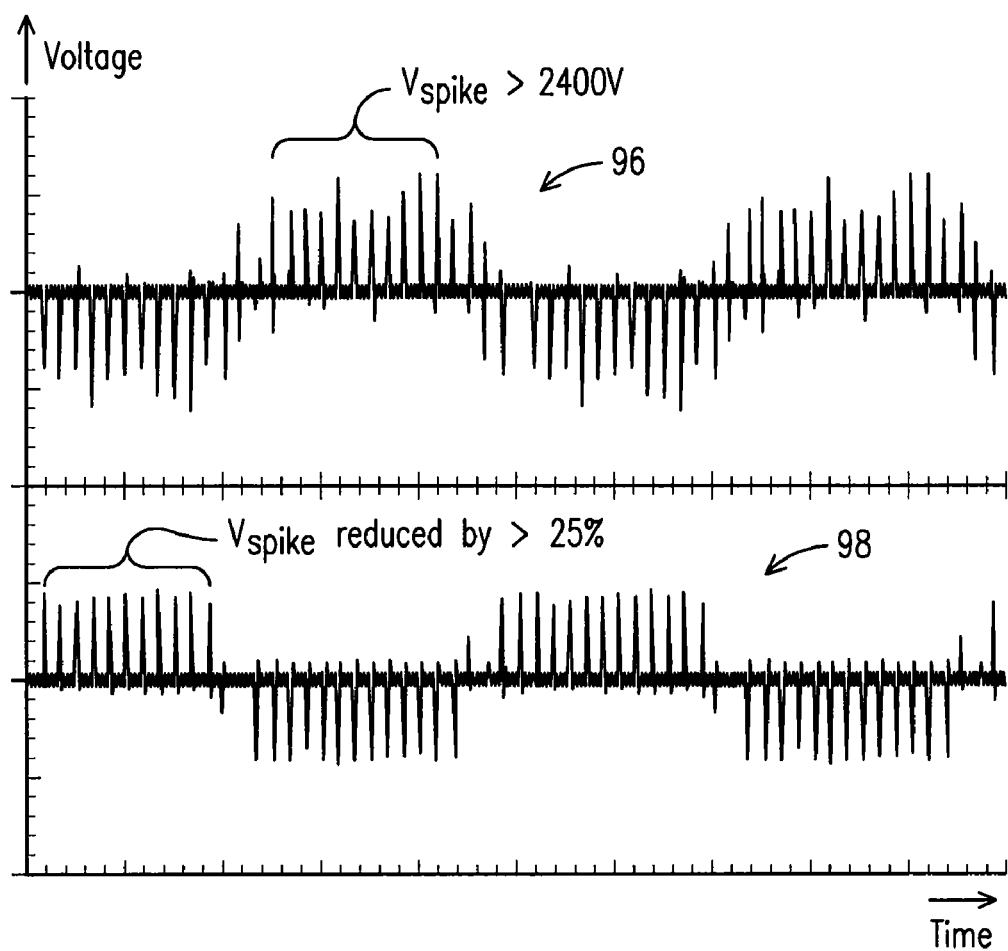
FIG. 4 illustrates comparative plots of voltage waveforms for illustrating voltage spike reduction in accordance with aspects of the present invention.

FIG. 4 illustrates comparative example voltage waveforms plotted as a function of time, for illustrating voltage spike reduction in accordance with aspects of the present invention. Example waveform 96 is representative of voltage spikes as may be produced in a power system under high dV/dt conditions without the benefits of signal conditioning circuit embodying aspects of the present invention. In one example power system application, voltage spikes in excess of 2400 V were observed. Example waveform 98 is representative of voltage spikes as may be attenuated with a signal conditioning circuit (e.g., filter) embodying aspects of the present invention. Note that in this example application the voltage spikes are attenuated at least 25% relative to the voltage spikes in waveform 96.

When it is referred to herein that a filter or other circuit is "based" on one or more circuit elements, e.g., resistor/capacitor-based filter, this means that the filter or other circuit includes at least one each of the stated circuit elements arranged to perform the stated function of the circuit, e.g., for a resistor/capacitor-based filter at least one resistor and at least one capacitor arranged to perform a filtering function.

In operation, using a common bus for the traction and auxiliary loads is conducive to reducing (or avoiding) costs that otherwise would be incurred in a dual bus implementation, such as needing another stage of power & voltage conversion. This advantageously allows for bi-directional flow of power between the traction and the auxiliary loads with higher efficiency. Moreover, using a common bus is conducive to a desirable reduction of components. For example, a common capacitor 41 (and/or bus bar) can now be used to connect the auxiliary and the traction inverters through the common bus instead of separate capacitors and/or bus bars for two separate buses. As shown in FIG. 1, capacitor 41 may be interconnected across a first power rail 45 (e.g., positive rail) and a second power rail 96 (e.g., negative rail) of the power bus.

While various embodiments illustrating aspects of the present invention have been shown and described herein, it will be understood that such embodiments are provided by way of example only. Numerous variations, changes and substitutions may be made without departing from the invention herein. Accordingly, it is intended that the invention be limited only by the spirit and scope of the appended claims.

What is claimed is:

1. A power system comprising:
   a power source;
   a power bus coupled to receive electrical power from the power source;
   a traction system coupled to the power bus, wherein the traction system comprises at least one electromotive machine having a first type of stator winding configured to provide a level of protection relative to voltage spikes expected at the traction stator under a first voltage level appropriate for the traction system;
   inverter circuitry coupled to draw electrical power from the bus to drive auxiliary equipment comprising at least one electromotive machine having a second type of stator winding configured to provide a level of protection relative to voltage spikes expected at the auxiliary stator under a second voltage level, wherein the second voltage level is lower than the first voltage level; and
   signal-conditioning circuitry coupled to attenuate repetitive voltage spikes produced by the inverter circuitry, wherein the power bus is operated at the first voltage level, and further wherein the voltage spike attenuation is sufficient to protect the auxiliary stator notwithstanding of operation of the power bus at the first voltage level, wherein the signal-conditioning circuitry comprises a filter, wherein the filter comprises a resistor/inductor/capacitor-based filter arranged in a Y-circuit topology, wherein each branch of the Y-circuit comprises a respective resistor, inductor and capacitor connected in series circuit.

2. The power system of claim 1, wherein the auxiliary stator winding comprises random-wound windings and the traction stator winding comprises form-wound windings.

3. The power system of claim 1, wherein a line separation from an output side of the inverter circuitry to an input side of the auxiliary load comprises a first distance, and further wherein said filter is located in a range from the output side of the inverter circuitry to a second distance downstream from the inverter circuitry, wherein the second distance is half the first distance.

4. The power system of claim 1, wherein a value of a reactance of the filter is based, at least in part, on a reactance of a load presented by the auxiliary equipment and an intrinsic reactance of a connecting line.

5. The power system of claim 1, wherein the signal-conditioning circuitry comprises at least one line interconnecting the inverter circuitry and the auxiliary equipment and wherein the attenuation of the voltage spikes is based on an impedance match between the auxiliary equipment and the interconnecting line.

6. The power system of claim 1, wherein the power system comprises a locomotive power system.

7. A power system comprising:
a power source;
a power bus coupled to receive electrical power from the power source;
a traction system coupled to the power bus, wherein the traction system comprises at least one electromotive machine having a first type of stator winding configured to provide a level of protection relative to voltage spikes expected at the traction stator under a first voltage level appropriate for the traction system;
inverter circuitry coupled to draw electrical power from the bus to drive auxiliary equipment comprising at least one electromotive machine having a second type of stator winding configured to provide a level of protection relative to voltage spikes expected at the auxiliary stator under a second voltage level, wherein the second voltage level is lower than the first voltage level; and
signal-conditioning circuitry coupled to attenuate repetitive voltage spikes produced by the inverter circuitry, wherein the power bus is operated at the first voltage level, and further wherein the voltage spike attenuation is sufficient to protect the auxiliary stator notwithstanding of operation of the power bus at the first voltage level, wherein the signal-conditioning circuitry comprises a filter, wherein the filter comprises a resistor/capacitor-based low-pass filter, wherein said filter is further based on inductance and is arranged in a Y-circuit topology, wherein each branch of the Y-circuit comprises a respective resistor and inductor connected in parallel circuit and further comprises a capacitor connected in series circuit to the parallel circuit.

8. The power system of claim 7, wherein a line separation from an output side of a given inverter circuitry to an input side of a given auxiliary load comprises a first distance, and further wherein said filter is located in a range from the input side of the auxiliary load to a second distance upstream from the auxiliary load, wherein the second distance is half the first distance.

9. The power system of claim 7, wherein a value of a reactance of the filter is based, at least in part, on a reactance of a load presented by the auxiliary equipment and an intrinsic reactance of a connecting line.

10. A power system comprising:
a power source;
a power bus coupled to receive electrical power from the power source;
a traction system coupled to the power bus, wherein the traction system comprises at least one electromotive machine having a first type of stator winding configured to provide a level of protection relative to voltage spikes expected at the traction stator under a first voltage level appropriate for the traction system;
inverter circuitry coupled to draw electrical power from the bus to drive auxiliary equipment comprising at least one electromotive machine having a second type of stator winding configured to provide a level of protection relative to voltage spikes expected at the auxiliary stator under a second voltage level, wherein the second voltage level is lower than the first voltage level; and
signal-conditioning circuitry coupled to attenuate repetitive voltage spikes produced by the inverter circuitry, bus is operated at the first voltage level, and further wherein the voltage spike attenuation is sufficient to protect the auxiliary stator notwithstanding of operation of the power bus at the first voltage level, wherein the signal-conditioning circuitry comprises a filter, wherein the filter comprises a resistor/capacitor-based low-pass filter, wherein a line separation from an output side of a given inverter circuitry to an input side of a given auxiliary load comprises a first distance, and further wherein said filter is located in a range from the input side of the auxiliary load to a second distance upstream from the auxiliary load, wherein the second distance is half the first distance.

11. A method for arranging and operating a powered system comprising:
coupling a power bus to receive electrical power from a power source;
coupling a traction system to the power bus, wherein the traction system comprises at least one electromotive machine having a first type of stator winding configured to provide a level of protection relative to voltage spikes expected at the traction stator under a first voltage level appropriate for the traction system;
drawing power from the power bus through inverter circuitry coupled to drive auxiliary equipment comprising coupling auxiliary equipment to the power bus wherein the auxiliary equipment comprises at least one electromotive machine having a second type of stator winding configured to provide a level of protection relative to voltage spikes expected at the auxiliary stator under a second voltage level, wherein the second voltage level is lower than the first voltage level;
operating the power bus at the first voltage level; and
conditioning signals from the inverter circuitry to the auxiliary equipment to attenuate voltage spikes produced by the inverter circuitry, wherein the voltage spike attenuation is sufficient to protect the auxiliary stator notwithstanding of operating the power bus at the first voltage level, wherein the signal conditioning comprises filtering the signals from the inverter circuitry to the auxiliary equipment, wherein a line separation from an output side of the inverter circuitry to an input side of the auxiliary load comprises a first distance, and wherein the method further comprises defining a first filter topology to be located in a range from the output side of the inverter circuitry to a second distance downstream from the inverter circuitry, wherein the second distance is half the first distance.

12. The method of claim 11, wherein the signal conditioning comprises establishing an impedance match between the auxiliary equipment and at least one line interconnecting the inverter circuitry and the auxiliary equipment.

13. The method of claim 11, wherein the method further comprises defining a second filter topology to be located in a range from the input side of the auxiliary load to a distance upstream from the auxiliary load, wherein the distance upstream from the auxiliary load is half the first distance.

14. The method of claim 11, wherein the signal conditioning comprises adjusting a switching speed of a power switching device in the inverter circuitry.

15. The method of claim 14, wherein the adjusting of the switching speed comprises reducing the switching speed as a function of cable length and a desired level of voltage spike suppression at the input side of the auxiliary load.

16. The method of claim 11, wherein the signal conditioning comprises a combination of at least two of the following:
filtering the signals from the inverter circuitry to the auxiliary equipment;
establishing an impedance match between the auxiliary equipment and at least one line interconnecting the inverter circuitry and the auxiliary equipment; and
adjusting a switching speed of a power switching device in the inverter circuitry.

* * * * *